(12) United States Patent
Burrell et al.

(10) Patent No.: US 8,431,253 B2
(45) Date of Patent: Apr. 30, 2013

(54) CUBIC NITRIDE TEMPLATES

(75) Inventors: Anthony K. Burrell, Los Alamos, NM (US); Thomas Mark McCleskey, Los Alamos, NM (US); Quanxi Jia, Los Alamos, NM (US); Alexander H. Mueller, Santa Fe, NM (US); Hongmei Luo, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 946 days.

(21) Appl. No.: 12/321,705

(22) Filed: Jan. 22, 2009

(65) Prior Publication Data

US 2009/0162673 A1 Jun. 25, 2009

Related U.S. Application Data

(63) Continuation-in-part of application No. 11/804,472, filed on May 17, 2007, which is a continuation-in-part of application No. 10/888,868, filed on Jul. 8, 2004, now Pat. No. 7,604, 839.

(60) Provisional application No. 61/063,094, filed on Jan. 30, 2008.

(51) Int. Cl.
*B32B 9/00* (2006.01)
*B32B 9/04* (2006.01)
*B32B 13/04* (2006.01)
*B32B 15/04* (2006.01)
*B32B 19/00* (2006.01)

(52) U.S. Cl.
USPC ........... 428/697; 428/446; 428/469; 428/698; 428/699; 428/701; 428/702

(58) Field of Classification Search ........... 257/E21.009, 257/E21.01; 428/446, 469, 697, 698, 699, 428/701, 702
See application file for complete search history.

(56) References Cited

U.S. PATENT DOCUMENTS

| 6,518,637 | B1 | 2/2003 | Thompson et al. |
| 6,818,061 | B2 | 11/2004 | Peczalski et al. |
| 7,211,852 | B2 | 5/2007 | Ramdani et al. |
| 7,250,640 | B2 | 7/2007 | Sarayama et al. |
| 7,449,065 | B1 | 11/2008 | Powell et al. |
| 7,473,315 | B2 | 1/2009 | Nakahata et al. |
| 2003/0209191 | A1 | 11/2003 | Purdy |
| 2005/0194593 | A1* | 9/2005 | Ramdani et al. ................. 257/52 |

OTHER PUBLICATIONS

Chow, Peter, "Large Area Si Substrates for InP Based Electronics and Optical Device Manufacturing (Final rept. Aug. 19, 2002-Jun. 19, 2003, Phase 1)", Superior Vacuum Technology, Inc., Eden Prairie, MN. Corp. Source Codes: 107420000; 427579, Jun. 18, 2003, 29pgs.*

(Continued)

*Primary Examiner* — Jonathan Langman
(74) *Attorney, Agent, or Firm* — Bruce H. Cottrell; Samuel L. Borkowsky

(57) ABSTRACT

A polymer-assisted deposition process for deposition of epitaxial cubic metal nitride films and the like is presented. The process includes solutions of one or more metal precursor and soluble polymers having binding properties for the one or more metal precursor. After a coating operation, the resultant coating is heated at high temperatures under a suitable atmosphere to yield metal nitride films and the like. Such films can be used as templates for the development of high quality cubic GaN based electronic devices.

3 Claims, 4 Drawing Sheets

OTHER PUBLICATIONS

Nieminen et al., "Surface-Controlled growth of LaAlO3 thin films by atomic layer epitaxy", Journal of Materials Chemistry, vol. 11, 2001, pp. 2340-2345.*
Lee et al., "MBE growth of Wurtzite GaN on LaAlO3 (100) substrate", Journal of Crystal Growth, vol. 213, Iss. 1-2, 2000, pp. 33-39.*
Fujioka et al., "Epitaxial growth of semiconductors on SrTiO3 substrates", Journal of Crystal Growth, vol. 229, 2001, pp. 137-141.*
Sharma et al., "Integration of Pb(Zr0.52Ti0.48)O3 epilayers with Si by domain epitaxy", Applied Physics Letters, col. 76, MNo. 11, 2000, pp. 1458-1460.*
Zhao et al., "Preparation of (001)-oriented PZT thin films on silicon wafers using pulsed laser deposition", Journal of Crystal Growth, col. 225, 2001, pp. 173-177.*
Kim et al., "Stabilization of zinc-blende cubic AlN in AlN/W superlattices", Journal of Vacuum Science and Technology A, vol. 19, No. 5, 2001, pp. 2069-2073.*

Nakamura et al., "High-Power InGaN/GaN Double-Heterostructure Violet Light Emitting Diodes," Applied Physics Letters, vol. 62 (May 1993) pp. 2390-2392.
Das et al., "Hot Electron Microwave Conductivity of Wide Bandgap Semiconductors," Solid-State Electronics, vol. 19 (Oct. 1976) pp. 851-855.
Narayan et al., "Domain Epitaxy: A Unified Paradigm for Thin Film Growth," Journal of Applied Physics, vol. 93 (Jan. 2003) pp. 278-285.
Fujioka et al., "Epitaxial Growth of Semiconductors on $SrTiO_3$ Substrates," Journal of Crystal Growth, vol. 229 (Jul. 2001) pp. 137-141.
Yang et al., "Capacitance-Voltage Characteristics of $BiFeO_3$/$SrTiO_3$/GaN Heteroepitaxial Structures," Applied Physics Letters, vol. 91 (Jul. 2007) pp. 022909-1-022909-3.
Tampo et al., "Strong Photoluminescence Emission from GaN on $SrTiO_3$," Physica Status Solidi (*b*), vol. 216 (Nov. 1999) pp. 113-116.
Wu et al., "Selective Growth of Cubic GaN on Patterned GaAs (100) Substrates by Metalorganic Vapor Phase Epitaxy," $3^{rd}$ International Conference on Nitride Semiconductors, Montpellier, France, Jul. 4-9, 1999, vol. 176, No. 1, pp. 557-560.

* cited by examiner

CUBIC NITRIDE TEMPLATES

RELATED APPLICATIONS

This application is a continuation-in-part of U.S. patent application Ser. No. 11/804,472 entitled "Polymer-Assisted Deposition of Films," filed May 17, 2007, which is a continuation-in-part of U.S. patent application Ser. No. 10/888,868 entitled "Polymer-Assisted Deposition of Films," filed Jul. 8, 2004 now U.S. Pat. No. 7,604,839, and claims the benefit of U.S. Provisional application Ser. No. 61/063,094 entitled "Cubic Nitride Templates," filed Jan. 30, 2008, all hereby incorporated by reference.

STATEMENT REGARDING FEDERAL RIGHTS

This invention was made with government support under Contract No. DE-AC52-06NA25396 awarded by the U.S. Department of Energy. The government has certain rights in the invention.

FIELD OF THE INVENTION

The present invention relates generally to metal nitrides, in particular cubic metal nitride films, and more particularly to polymer-assisted solution deposition of such metal nitride films as epitaxial templates.

BACKGROUND OF THE INVENTION

Tremendous efforts have been devoted to epitaxially grow low defect density GaN layers since Nakamura and co-workers first reported the fabrication of GaN-based light emitting diodes (LEDs) in 1993 (S. Nakamura, M. Senoh, and T. Mukai, Appl. Phys. Lett. 62, 2390 (1993)). This is because of the difficulties in the growth of bulk GaN crystals. For example, a temperature of close to 2000° C. and nitrogen pressure of up to 20 kbar are needed to grow such bulk crystals. The limited crystal size further restrains the bulk technology for practical use. For the lack of adequate GaN substrates, epitaxial GaN layers are commonly grown on substrates to which they are both lattice and thermally mismatched.

The preparation of high quality active epitaxial GaN layers is the most important step for the fabrication of GaN-based LEDs. The most common and successful techniques to grow epitaxial GaN films (on foreign substrates) are metalorganic chemical vapor deposition (MOCVD), molecular beam epitaxy (MBE), and hydride vapor phase epitaxy (HVPE). Sapphire ($Al_2O_3$) is the most widely used substrate from the growth of hexagonal or wurtzite GaN. As-grown GaN layers contain a high density of threading dislocations because of the large mismatches both in the lattice parameters and the thermal expansion coefficients between the GaN film and the substrate.

Theoretically, cubic GaN possesses superior electronic properties for device applications since it provides high optical gain, (P. Das and D. K. Ferry, Solid-State Electron. 19, 851, (1976)) higher carrier mobility, easier p-type doping, and a narrower energy band gap. These properties make it easier to fabricate LEDs that can reach the blue and green regions. In addition, its cubic symmetry offers the isotropic properties that the hexagonal form cannot supply. However, such advantages have not been fully realized due to the difficulty in producing phase pure material. For instance, hexagonal GaN is thermodynamically stable. The cubic GaN can be only deposited on suitable substrates such as (100) GaAs, (100) MgO, (100) 3C—SiC, and (100) Si.

Even though the most commonly used substrate for the epitaxial growth of cubic GaN is GaAs, the direct nucleation of GaN on GaAs proves to be extremely difficult due to the short bond length in GaN compared to GaAs and the presence of native oxide on the surface of GaAs. The lower thermal stability of GaAs adds other limitations to using GaAs as a template for the epitaxial growth of cubic GaN.

Currently there are no practical routes to cubic GaN substrates and as such the advantages of LEDs prepared using this material cannot be realized.

SUMMARY OF THE INVENTION

To achieve the foregoing and other objects, and in accordance with the purposes of the present invention, as embodied and broadly described herein, the present invention provides for a group-13 metal nitride based device. The device includes a layer of MgO, a buffer layer on the layer of MgO, and an epitaxial layer of a group-13 metal nitride on the buffer layer. The epitaxial layer of group-13 metal nitride has a cubic structure.

The present invention further provides a process of preparing a layered structure including a uniform, highly ordered, group-13 metal nitride film. This process includes applying a homogenous solution, the solution containing a soluble group-13 metal precursor and a soluble polymer, onto a substrate to form a polymer and group-13 metal containing layer thereon, the polymer characterized as having metal binding properties; heating the substrate in a reducing atmosphere at temperatures and for time characterized as sufficient to remove the polymer from said polymer and group-13 metal containing layer and form a uniform highly ordered group-13 metal nitride film; and applying a second, highly ordered, layer of group-13 metal nitride by MOCVD, MBE or HVPE, onto the uniform highly ordered group-13 metal nitride film.

DETAILED DESCRIPTION

Figure 1:
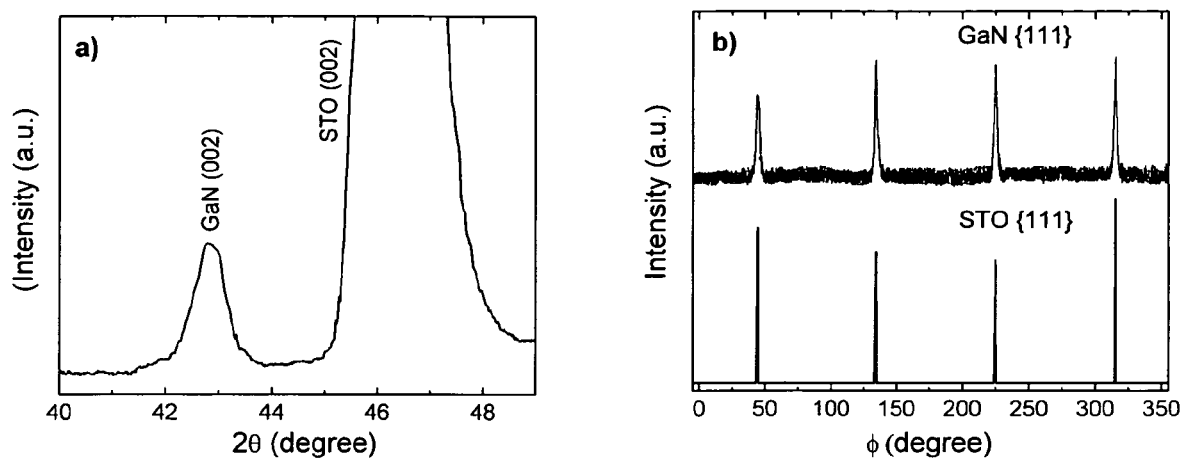
FIG. 1 shows (a) an x-ray diffraction 2θ-scan and (b) φ-scans from (111) GaN and (111) $SrTiO_3$ substrate, where GaN was deposited by PAD.

The present invention provides a chemical solution deposition method of forming cubic metal nitride films, such a chemical solution deposition method including the deposition of a metal precursor and a soluble polymer where the polymer has binding properties for the metal precursor. The structure of the metal nitride film is cubic and epitaxial.

The present invention is concerned with a process for preparing metal-containing films such as metal nitride films and the like, from solutions, optionally in an organic solvent-free process. The metal nitride films can be prepared with an epitaxial structure. Additionally, it has been found that the metal-containing films made in accordance with the present invention can be formed crack-free. This is in contrast to the cracking that sometimes resulted in various prior techniques.

The process of the present invention uses a soluble polymer to assist in the deposition of the desired metal nitride. Thus, the process can be referred to as a polymer-assisted deposition (PAD) process. Inclusion of a soluble polymer with a single metal precursor or multiple metal precursors promotes better distribution of the materials during the deposition. The polymer can be removed subsequently by heating at sufficiently high temperatures to eliminate the polymer and form a metal nitride film. The resultant metal nitride film can be prepared with 3D registry, i.e., the film can be prepared with an epitaxial structure. By using a soluble polymer in conjunction with one or more metal precursors, single or mixed compound/complex metal nitride films can be prepared. In one embodiment, the overall process can be an aqueous process that can be organic solvent free.

Formation of the nitride depends upon the proper selection of precursor and atmosphere during heating. The polymer can not only control the desired viscosity for the process, but also binds the metal ions to prevent premature precipitation and formation of metal oxide oligomers. The results are found to be a homogeneous distribution of the metal precursors in the solution and the formation of uniform metal organic films. PAD can grow high quality epitaxial cubic GaN and other group 13 metal nitride films on substrates of, e.g., $SrTiO_3$ or $LaAlO_3$. These films can then serve as templates for the growth of high quality thick cubic nitrides (served as an active layer for electronic or electro-optical devices) using metalorganic chemical vapor deposition (MOCVD), hydride vapor phase epitaxy (HVPE) or molecular beam epitaxy (MBE).

The heating of the polymer and metal layer is generally carried out under a reducing atmosphere. For example, in the case where it is desired to reduce a metal precursor to obtain a metal nitride film, the reducing atmosphere can include, e.g., hydrogen, ammonia, formaldehyde, carbon monoxide, formic acid or other reducing agents well known to those skilled in the art.

The metal-containing films (the metal, the nitride and the like) of the present invention are uniform films, i.e., they are continuous films covering the target substrate.

The soluble polymer used in the present process has binding properties for the metal precursors used to form the metal nitride film and can be, e.g., polyethylenimine (PEI), a substituted PEI or PEI derivative such as a carboxylated-polyethylenimine (PEIC), a phosphorylated-polyethylenimine (PEIP), a sulfonated-polyethylenimine (PEIS), an acylated-polyethylenimine, hydroxylated water-soluble polyethylenimines and the like or a polymer such as polyacrylic acid, polypyrolidone, and poly(ethylene-maleic acid). PEI or substituted PEIs such as PEIC are generally the preferred polymers. Substituted or PEI derivatives are post modified after formation of the base polymer. Typically, the molecular weight of such polymers is greater than about 30,000. By "binding" it is meant that the polymer and the metal are bound through any of various mechanisms such as electrostatic attraction, hydrogen bonding, covalent bonding and the like. The "binding" relates to the interaction of the metal and polymer where the binding constant is greater than 10000 mol $L^{-1}$.

In order to have good processing characteristics, a precursor solution for metal nitride films must have a suitable viscosity. In the present invention, polymer plays dual functions. In other words, a polymer is also used to assist the viscosity desired for metal nitride film processing.

The solutions used in depositing the polymer and metal to the substrates are homogeneous solutions. By "homogeneous" is meant that the solutions are not dispersions or suspensions, but are actual solutions of the polymer, metal complexes and any metal binding ligands.

The criteria on the choice of polymers are that they be soluble, undergo a clean decomposition upon heating at high temperatures, e.g., temperatures over about 250° C., and are compatible with the metal compounds. PEI decomposes completely and cleanly above 250° C. and leaves no residual carbon in the film. This feature makes PEI and derivatives thereof especially preferred polymers in the practice of the present invention.

By aiding in the desired viscosity, such polymers can allow processing of the metal nitride precursor solution into desired configurations such as films. The desired viscosity can be achieved through controlling the solution concentration of the soluble polymers and by controlling the molecular weight of the polymer. For high quality homogeneous films, polymer concentrations and the polymer ratio to metal components should be maintained at a proper balance. The rheology of the metal nitride precursor solution can also be important for the morphology and quality of the final metal nitride films. In order to form smooth films, the polymer solution must have suitable rheological properties so that any spin-coated film has no undesired patterns associated with polymer rheological properties.

The polymer further functions as binding agent to the metals within the precursor solution in assisting the formation of an intermediate deposited polymer-metal composite film and ultimately a metal nitride film. This requires that the polymer should also have suitable interactions to metal ions such that no phase separation occurs during the deposition processes. Thereafter, the deposited polymer-metal composite films are heated at high temperatures, e.g., at temperatures above about 250° C. to obtain the final metal nitride films. Thus, the soluble polymer selection should also have suitable decomposition characteristics, e.g., a clean decomposition under such conditions, so that the final metal nitride film can be free of side products.

The general approach of the present invention can be applied to metal nitrides.

The metals include group 13 metals such as aluminum, gallium, and indium.

The present invention may also employ fluoride complexes as precursors in the process of the present invention. For example, a gallium hexafluoride anion ($GaF_6^{3-}$) can be formed by the addition of gallium nitrate and ammonium bifluoride and can be used as the metal precursor.

Metal nitride films that can be prepared by the present process can include a metal nitride with a single metal, can be a metal nitride with two metals or three metals or may be a metal nitride including four or more metals. Among the metal nitrides that can be prepared by the present process are included gallium nitride, gallium nitride and indium nitride and the like. Among the mixed metal nitrides that can be prepared by the present process are included gallium indium nitride and the like. The metal nitride films prepared by the present process can serve as wide bandgap semiconductors. The preparation of metal nitride films can be accomplished by depositing a polymer and metal containing layer upon a suitable substrate, but the heating can then be conducted under an ammonia-containing atmosphere or a reducing atmosphere to yield the desired nitride materials.

In one aspect of the present invention, composites can be prepared including the various metal-containing nitride films as described with various additional additives to provide tailoring of the material properties. Among the additives can be nanoparticles, especially nanoparticles of various metals such as transition metals, lanthanide metals or main group metals, nanoparticles of various metal oxides including one or more metal such as a transition metal, a lanthanide metal or a main group metal, nanoparticles of various metal nitrides including one or more metal such as a transition metal, a lanthanide metal or a main group metal, nanoparticles of various metal carbides including one or more metal such as a transition metal, a lanthanide metal or a main group metal, nanoparticles of various metal chalcogenides including one or more metal such as a transition metal, a lanthanide metal or a main group metal, nanoparticles of various metal pnictogenides including one or more metal such as a transition metal, a lanthanide metal or a main group metal, nanoparticles of various metal borides including one or more metal such as a transition metal, a lanthanide metal or a main group metal, or nanoparticles of various metal suicides including one or more metal such as a transition metal, a lanthanide metal or a main group metal. Examples of such nanoparticles can include titanium dioxide, strontium oxide, erbium oxide and the like, such nanoparticles suitable for modifying the physical and electronic properties of metal nitride films of a different material. The inclusion of nanoparticles will help control both electronic properties and physical properties such as defect density.

The composition, e.g., solution, used for the deposition includes the soluble polymer and the metal precursors. In addition, other metals can be included through addition of appropriate metal salts. For example, gallium can be added through a gallium salt such as gallium acetate. Other suitable metal salts may include metal nitrates, metal oxalates, metal acrylates, and metal coordination complexes.

The solvent for dissolution of the soluble polymer can be, e.g., water, lower alcohols such as methanol, ethanol, propanol and the like, acetone, propylene carbonate, tetrahydrofuran, acetonitrile, acetic acids and mixtures thereof such as water and ethanol and the like. As the soluble polymer used in the present invention includes binding properties for the metals or metal precursors used in formation of the metal nitride films, the polymer can help provide the necessary solubility to the respective metals, e.g., metal precursors. In some instances, the metal can initially be in a metal complex such as a complex of the respective metal with a metal binding ligand or salt thereof such as ethylenediaminetetraaceticacid (EDTA) or salts thereof such as dipotassium ethylenediaminetetraaceticacid. EDTA-metal complexes are generally soluble within solutions including a soluble polymer with binding properties for the metal precursors such as PEI and the like.

Among suitable metal binding ligands besides EDTA and salts thereof can be included other carboxylic acid ligands such as ethylenediaminediaceticacid (EDDA), trans-1,2-diamino-cyclohexan-N,N,N',N'-tetraacetic acid (CDTA), ethyleneglycol-O,O'-bis-(2-aminoethyl)-N,N,N',N'-tetraacetic acid (EGTA), diethylenetriamine-pentaacetic acid (DTPA), N-(2-hydroxyethyl)-ethylenediamine-N,N',N'-triacetic acid (HEDTA), nitrilotriacetic acid (NTA), triethylentetramine-N,N,N',N'',N''',N'''-hexaacetic acid (TTHA) and the like, polypyridyl ligands such as terpyridine, 2,2'-bypyridine, 1,10-phenanthroline and the like, beta-diketone (acetylacetonate) ligands such as 2,4-propanedione and derivatives thereof, catecholate and aryl oxide or alkyl oxide ligands, macrocyclic ligands such as cyclam, cyclen, triazacyclononane and derivatives thereof, or other simple ligands such as aquo ($H_2O$) and amines ($NH_3$), i.e., $Ga(NH_3)_6^{3+}$. Shiff-base ligands such as trimethylenediaminetetramethylglyoximato ligand or the salen type ligands may also be used.

The starting solution is typically maintained at ambient temperatures from is about 15° C. to about 30° C., more usually from about 20° C. to about 25° C. Within those temperature ranges, the materials added to the solution are soluble. In preparation of solutions used in the present process, the solutions using a polyethylenimine as the metal binding polymer can be filtered prior to use to remove any non-soluble components. One exemplary process in the preparation of the solutions involves filtering the precursor solution through an Amicon ultrafiltration unit containing a PM 10 ultrafiltration membrane. Such a filter is designed to pass materials having a molecular weight of less than about 10,000 g/mol (e.g., unbound metal, smaller polymer fragments and the like) while retaining the desired materials of a larger size. Ultrafiltration allows for removal of any unwanted salts such as cations, anions or other impurities.

The metal ratio can be controlled through appropriate addition of metal precursors to the solvent used in the deposition. Such solutions can generally have a shelf life of more than a year.

In one embodiment of the present invention, the starting solution can be deposited on a desired substrate, e.g., by spray coating, dip coating, spin coating, ink jet printing and the like. After deposition of the starting solution on a substrate, the deposited coating must be heated under a suitable atmosphere at high temperatures of from about 250° C. to about 1300° C., preferably from about 400° C. to about 1200° C. for a period of time sufficient to remove the polymer and to form only the metal nitride film. Heating times may be varied and may be longer depending upon the thickness of the deposited film.

Optionally, the deposited coating can be initially dried by heating to temperatures of from about 50° C. to about 150° C. for from about 15 minutes to several hours, preferably for less than one hour. The deposited polymer-metal containing film undergoes removal of a percentage of volatile species during such an initial drying stage.

The resultant metal nitride films from the present process have been optical quality films in that they are highly smooth films with a mirror-like appearance. The films have been found to be epitaxial in structure, where the epitaxy of the films is directed by the choice of substrate.

The present invention enables the processing of metal nitride films with convenience and flexibility required in industrial fabrication. This process involves making metal nitride films from solutions—optionally in an organic solvent-free process. Cubic gallium nitride (GaN) and aluminum nitride (AlN) films have been prepared using aqueous polymer-assisted deposition (PAD) techniques. X-ray diffraction measurement indicates that the gallium nitride and aluminum nitride films on substrates, such as $SrTiO_3$ and $LaAlO_3$, can be preferentially oriented out of plane. They can also be epitaxial as confirmed from x-ray φ-scans of the films and the diffraction pattern of the transmission electron microscopy.

The films prepared are suitable for use as templates for the further growth of cubic nitrides. Thus MOCVD, HVPE or MBE growth of GaN on the PAD prepared epitaxial GaN will result in high quality thick GaN suitable for electronic applications.

The polymer is used to bind metals and metal precursors. This allows the removal of any unwanted anions or cations by filtration, e.g., through an Amicon ultrafiltration unit, and can bring multiple metals together in a homogeneous manner at a molecular level. This also prevents selective precipitation of unwanted metal oxide phases as a portion of the water can be removed and the metals concentrated within the remaining solution. Even at the extreme of just polymer and metal, the dried solution (a gel) includes only well dispersed metal atoms bound to the polymer. This can be done in one of three ways.

In a first manner, a single polymer (such as carboxylated polyethyleneimine) can be added to a solution containing simple salts (such as nitrate) of two or more metals in the correct ratio. If the binding constant is high for both metals then they will remain in the correct ratio during filtration and concentration of the polymer.

In a second manner, the metals can be bound individually to one or more polymers and concentrated. The resulting solution can be examined by ICP to determine metal content and then mixed appropriately prior to spin coating. Different polymers and different solvents can be used for different metals in this system.

In a third manner, metal complexes such as a metal-EDTA complex can be prepared and mixed in the desired ratios. These complexes can then be bound to a polymer (such as polyethyleneimine) and concentrated.

Regardless what materials being coated by PAD, a post thermal-treatment process is necessary to thermally remove off the polymer, and to form the right phase of the materials.

The choice of substrate materials is closely related to the applications. The lattice constant matched substrate is needed if epitaxy is the objective. For example, c-plane sapphire has been used as the substrate for epitaxial growth of hexagonal GaN. Other materials such as $SrTiO_3$ can be used as the substrate for epitaxial growth of cubic InN, GaN and AlN.

The coating is done using a spin coater. The spin speed is controlled in the range of 10 to 10.000 RPM depending on the viscosity of the solutions. It should be noted that other coating techniques such as dip-coating can be also used since this technology uses solution.

The post-thermal treatment conditions such as post-annealing temperature and ambient change in a wide range depending on the objectives of the materials deposited. For example, to grow epitaxial nitride films on $SrTiO_3$ substrate, a slow warming up (1~10° C./min) from room temperature to 500° C. in an atmosphere of a forming gas (about 6% $H_2$ and about 94% $N_2$) can be used to make sure that the polymers will be completely removed. Then the annealing was ramping up (at a rate of 60° C./min) to a higher temperature (650 to 1030° C.) for the formation of right phase and structures. This was done in an ammonia environment. The choice of final annealing temperature depends on the microstructures required if an epitaxial growth is preferred.

Figure 2:
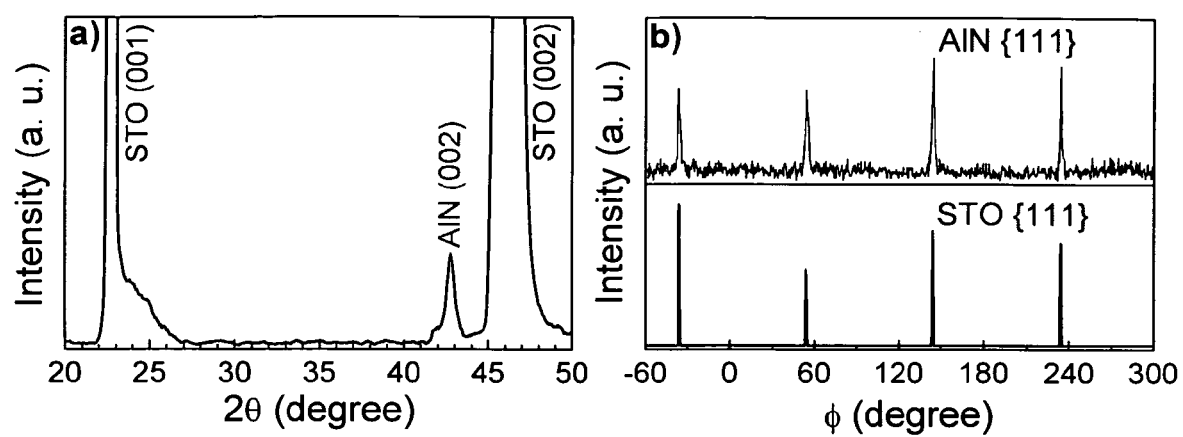
FIG. 2 shows (a) an x-ray diffraction 2θ-scan and (b) φ-scans from (111) AlN and (111) $SrTiO_3$, where AlN film was deposited by PAD.

The epitaxial growth of cubic GaN, and AlN on $SrTiO_3$ can be clearly seen from the x-ray diffraction results shown in FIGS. 1-2.

The XRD pattern for AlN films annealed at 1000° C. showed AlN formed with a hexagonal structure on quartz. The XRD results from the 0-20 scan and the phi (φ) scan for GaN and AlN films annealed at 950-1000° C. on $SrTiO_3$ substrates showed only (002) peak from the GaN or the AlN, indicating that the films were preferentially oriented along the c-axis perpendicular to the substrate surface. The in-plane orientation between the film and substrate was determined by XRD φ-scans from (111) GaN or AlN and (111) $SrTiO_3$ substrate, respectively. Four peaks appeared in the φ-scans. An average FWHM value of 2° for GaN and 2° for AlN films as compared to 0.70 for that of the single crystal $SrTiO_3$, indicated the film to be of good epitaxial quality.

The surface morphology of all the films was checked by SEM. The films were found very smooth without obvious difference in SEM images. The surface roughness was checked by AFM. The films were dense, uniform and very smooth with grain size of around 10-14 nm, and with no detectable micro-cracks. The surface roughness (root mean square) was only 0.3 nm.

Silicon has many advantages over other templates such as the availability of large area substrates, good mechanical strength, and high thermal conductivity. Importantly, the superior native oxide on Si makes it the material choice for digital circuits. In other words, advantage can be taken of the best characteristics of both GaN and Si. It is possible to integrate these two materials into a single platform for LEDs. While there has been significant effort in the growth of GaN on silicon no other method has demonstrated the formation of a known stable cubic-GaN template on silicon.

The use of cubic $SrTiO_3$ as a buffer layer to grow GaAs on Si is well established. The resulting GaAs shows defect density less than $10^5/cm^2$ and high carrier mobility. This structure is, however, grown by MBE, limiting its widespread commercial application. It is well known that only a limited number of oxides are compatible with Si because of the thermodynamic stability of silicon dioxide. One of such oxides is MgO, which is a highly ionic, insulating crystalline solid with a rocksalt structure. However, the lattice misfit between MgO and silicon is 22.5% which should preclude epitaxy. Despite the large mismatch, epitaxial MgO has been prepared (based on so called "domain-matching epitaxy"—where the integral numbers of film lattices match with the integral numbers of substrate lattices, see J. Narayan, B. C. Larson Journal of Applied Physics vol. 93, p. 278, 2003) by a number of techniques. The epitaxial growth of MgO on Si is much easier compared to epitaxially grown $SrTiO_3$ directly on Si.

Figure 3:
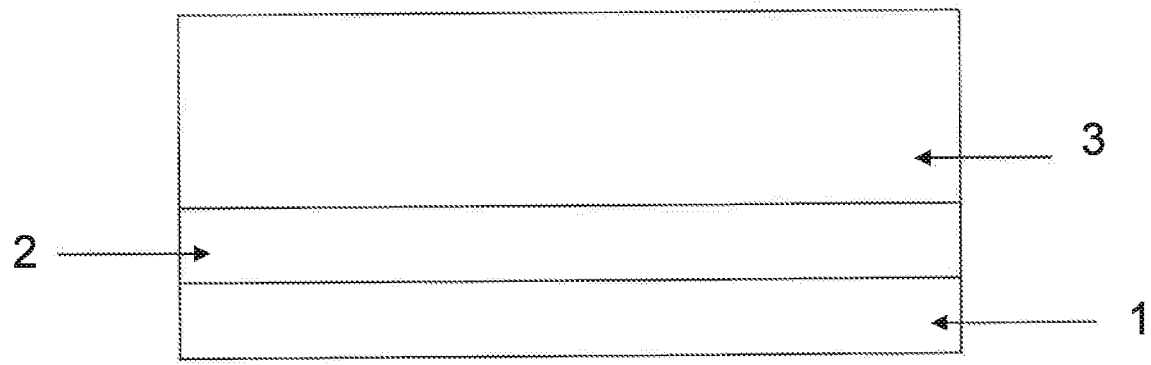
FIG. 3 shows a generic architecture of an epitaxial group-13 nitride on $SrTiO_3$ on a MgO substrate.
Figure 4:
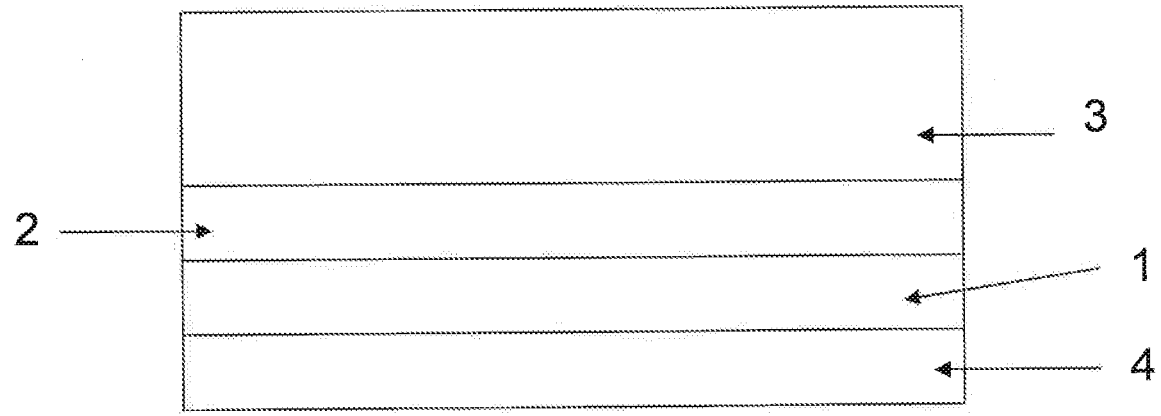
FIG. 4 shows a generic architecture of an epitaxial group-13 nitride on $SrTiO_3$ on MgO on a silicon substrate.
Figure 5:
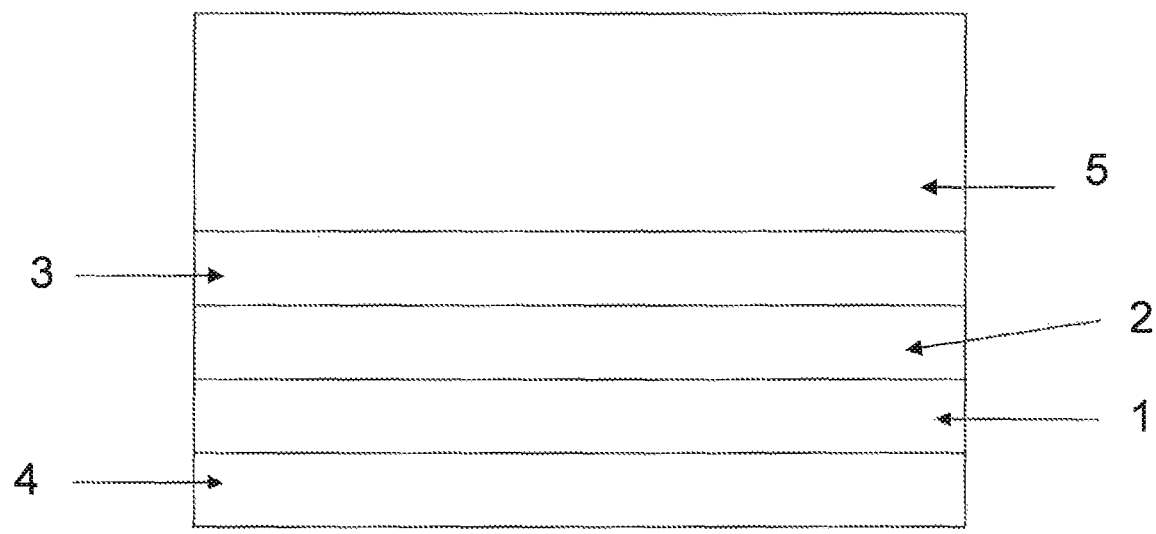
FIG. 5 shows a generic architecture of an epitaxial group-13 nitride on $SrTiO_3$ on MgO on a silicon substrate with an additional layer of a group-13 nitride on top.

The ability and feasibility for the monolithic integration of metal-oxide films such as $SrTiO_3$ with Si make it possible to grow high quality GaN on Si. PAD growth of the cubic-GaN directly onto the $SrTiO_3$ or an AlN nitride layer, or mixed AlGaN buffer layer on top of the $SrTiO_3$. These layers can be prepared cost effectively by sputtering ($SrTiO_3$) and PAD (nitrides). The simplest generic multilayer structure is shown in FIG. 3, where region 1 is single crystal MgO substrate and the region 2 is an epitaxial layer such as $SrTiO_3$, region 3 is a PAD deposited cubic GaN layer. An alternative system is shown in FIG. 4 where the primary single crystalline substrate is now silicon (region 4). In the construction of silicon based devices as shown in FIG. 5, the silicon (region 4) will be layered using an epitaxial MgO (region 1) followed by an epitaxial layer of $SrTiO_3$ (region 2) and then the group-13 nitride (region 3) followed by the thick layer group-13 nitride (region 5) applied by using another technique such as MOCVD, HVPE or MBE. It should be noted these drawings or layered structures are not in scale. They are for illustration only.

A gallium nitride-based compound semiconductor device can have a thickness of the first PAD deposited layer of about 5 nm to about 500 nm where the top GaN-layer is often 50 nm or greater and 10000 nm or smaller.

This multilayer architecture can be used as a platform for developing the next generation LEDs. The structure consists of two layers (for example MgO and $SrTiO_3$), potential intermediate nitride buffer layers, one template (GaN by PAD), and the active cubic GaN layer for LEDs.

The present invention is more particularly described in the following examples which are intended as illustrative only, since numerous modifications and variations will be apparent to those skilled in the art.

EXAMPLES 1-12 describe the deposition of such metal nitride films or other metal nitride containing films using such solutions. Polyethylenimine was obtained from BASF as a water free, branched, polymer with an average MW of 50,000. Water was deionized via reverse osmosis (having a resistivity>18 MOhms).

EXAMPLE 1

An Al solution was formed as follows. Aluminum nitrate nonahydrate and ethylenediaminetetraaceticacid and polyethylenimine: Two grams of ethylenediaminetetraaceticacid was placed in a 50 mL Falcon tube and 40 mL of nanopure water were added. The ethylenediaminetetraaceticacid does not dissolve at this stage. 2.6 g of aluminum nitrate nonahydrate was added to the solution followed by 2.2 g of polyethylenimine (BASF) and the solution was agitated until everything was dissolved. After stirring the solution was placed in an Amicon filtration unit containing a PM 10 filter designed to pass materials having a molecular weight <10,000 g/mol. The solution was diluted to 200 mL and then concentrated to 10 mL in volume. Final concentration of aluminum was 119 mM.

EXAMPLE 2

A solution including gallium chloride and polyethylenimine in ethanol was prepared as follows. An amount of 5 grams of polyethylenimine were dissolved in 95 grams of ethanol. The solution was dried over molecular sieves for two days and then filtered through a 0.49 micron filter. About 20 mL of the solution were placed in a 50 mL Falcon tube and 0.6 grams of gallium chloride were added in an inert atmosphere. A precipitate appeared and then dissolved into solution. This solution was placed in an Amicon ultrafiltration unit containing a YM 10 ultrafiltration membrane designed to pass materials having a molecular weight <10,000 g/mol. The solution was diluted to 200 mL with absolute ethanol and then concentrated to 10 mL in volume. After filtration, the viscosity of the solution was further increased by removing a small amount of solvent by rotary evaporation under reduced pressure. Inductively coupled plasma-atomic emission spectroscopy showed that the final solution had 14.3 mg/mL of Ga.

EXAMPLE 3

A solution including aluminum-doped gallium was prepared as follows. An amount of 200 mg of the concentrated solution from example 1 was mixed with 3.8 grams of the solution from example 2. The resulting solution was clear and homogenous. This method can be used to generate a wide variety of aluminum doped gallium solutions by simply mixing in the appropriate ratios.

EXAMPLE 4

The solution from example 2 was spin-coated on single crystalline (001) $SrTiO_3$ (STO) substrate. The film were heated in forming gas at 510° C. for 2 hours, then annealed in ammonia gas at 900-1030° C. for 1 hour. The resultant cubic gallium nitride film was 40-50 nm thick. Forming gas is a gaseous mixture of up to 10% hydrogen in an inert gas such as nitrogen or argon. In this Example and in the others, unless otherwise stated, the forming gas used was a gaseous mixture of 6% hydrogen gas and 94% nitrogen gas.

EXAMPLE 5

The solution from example 1 was spin-coated on single crystalline (001) $SrTiO_3$ (STO) substrate. The film were heated in forming gas at 510° C. for 2 hours, then annealed in ammonia gas at 900-1030° C. for 1 hour. The resultant cubic aluminum nitride film was 40-50 nm thick.

EXAMPLE 6

The solution from example 3 was spin-coated on single crystalline (001) $SrTiO_3$ (STO) substrate. The film were heated in forming gas at 510° C. for 2 hours, then annealed in ammonia gas at 900-1030° C. for 1 hour. The resultant cubic aluminum gallium nitride film was 40-50 nm thick.

EXAMPLE 7

As another alternative preparation, the solution from example 2 is spin-coated on a buffer layer of epitaxial $SrTiO_3$ (STO) on a single crystalline MgO substrate. The film is heated in forming gas at 510° C. for 2 hours, then annealed in ammonia gas at 900-1030° C. for 1 hour.

EXAMPLE 8

As another alternative preparation, the solution from example 1 is spin-coated on a buffer layer of epitaxial (001) $SrTiO_3$ (STO) on a single crystalline MgO substrate. The film is heated in forming gas at 510° C. for 2 hours, then annealed in ammonia gas at 900-1030° C. for 4 hours.

EXAMPLE 9

As another alternative preparation, the solution from example 1 is spin-coated on a buffer layer of epitaxial (001) $SrTiO_3$ (STO) on an epitaxial layer of MgO on a single crystalline silicon substrate. The film is heated in forming gas at 510° C. for 2 hours, then annealed in ammonia gas at 900-1030° C. for 1 hour.

EXAMPLE 10

As another alternative preparation, the solution from example 3 is spin-coated on a buffer layer of epitaxial cubic AlN (001) on an epitaxial $SrTiO_3$ layer on an epitaxial layer of MgO on a single crystalline silicon substrate. The film is heated in forming gas at 510° C. for 2 hours, then annealed in ammonia gas at 900-1030° C. for 1 hour.

EXAMPLE 11

As another alternative preparation, the solution from example 3 is spin-coated on a buffer layer of epitaxial cubic AlN (001) on an epitaxial $SrTiO_3$ layer deposited on an epitaxial MgO on a single crystalline silicon substrate. The film is heated in forming gas at 510° C. for 2 hours, then annealed in ammonia gas at 900-1030° C. for 1 hour.

EXAMPLE 12

A device from example 10 is prepared and further GaN is deposited by MOCVD to give a 1 micron thick film of cubic GaN as the top layer.

The foregoing description of the invention has been presented for purposes of illustration and description and is not intended to be exhaustive or to limit the invention to the precise form disclosed, and obviously many modifications and variations are possible in light of the above teaching. One skilled in the art would also appreciate that while only a few layers are described as deposited by MOCVD, MBE and HEVP many other compositions can been applied using these methods.

The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A device, comprising:
    a layer of MgO,
    a buffer layer of $SrTiO_3$ directly on said layer of MgO, and
    an epitaxial layer of a group-13 metal nitride having a cubic structure directly on said buffer layer, said epitaxial layer selected from the group consisting of aluminum nitride, gallium nitride, and aluminum gallium nitride.

2. The device of claim 1, further comprising a silicon substrate, wherein said layer of MgO is on said silicon substrate.

3. A device, comprising:
    a layer of MgO,
    a buffer layer of $LaAlO_3$ directly on said layer of MgO, and
    an epitaxial layer of a group-13 metal nitride having a cubic structure on said buffer layer, said epitaxial layer selected from the group consisting of aluminum nitride, gallium nitride, and aluminum gallium nitride.

* * * * *